United States Patent
Cheng et al.

(10) Patent No.: US 11,075,238 B2
(45) Date of Patent: Jul. 27, 2021

(54) METHOD OF MANUFACTURING IMAGE SENSOR

(71) Applicant: Taiwan Semiconductor Manufacturing Co., Ltd., Hsinchu (TW)

(72) Inventors: Ching-Hung Cheng, Hsinchu County (TW); Kai-Fung Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/524,157

(22) Filed: Jul. 28, 2019

(65) Prior Publication Data

US 2019/0355771 A1    Nov. 21, 2019

Related U.S. Application Data

(63) Continuation of application No. 15/884,349, filed on Jan. 30, 2018, now Pat. No. 10,367,018.

(60) Provisional application No. 62/583,445, filed on Nov. 8, 2017.

(51) Int. Cl.
*H01L 27/146* (2006.01)
*H04N 5/3745* (2011.01)
*H04N 5/374* (2011.01)

(52) U.S. Cl.
CPC .. *H01L 27/14612* (2013.01); *H01L 27/14618* (2013.01); *H01L 27/14623* (2013.01); *H01L 27/14643* (2013.01); *H01L 27/14685* (2013.01); *H01L 27/14689* (2013.01); *H04N 5/3741* (2013.01); *H04N 5/37452* (2013.01); *H01L 27/14636* (2013.01)

(58) Field of Classification Search
None
See application file for complete search history.

(56) References Cited

U.S. PATENT DOCUMENTS

| 7,935,994 B2 | 5/2011 | Wang et al. |
| 8,383,440 B2 | 2/2013 | Wang et al. |
| 9,276,031 B2 | 3/2016 | Wan |

(Continued)

FOREIGN PATENT DOCUMENTS

| TW | 201119374 | 6/2011 |
| TW | 201717372 | 5/2017 |

OTHER PUBLICATIONS

"Office Action of Taiwan Counterpart Application", dated Jan. 27, 2021, pp. 1-9.

(Continued)

*Primary Examiner* — Long Pham
(74) *Attorney, Agent, or Firm* — JCIPRNET (57) ABSTRACT

A method of manufacturing an image sensor includes at least the following steps. A storage node is formed in a substrate. A gate dielectric layer, a storage gate electrode, and a first dielectric layer are sequentially formed over the substrate. A portion of the first dielectric layer is removed to form an opening. A protection layer and a shielding layer are sequentially filled into the opening. The protection layer laterally surrounds the shielding layer and at least a portion of the protection layer is located between the storage gate electrode and the shielding layer. A second dielectric layer is formed over the shielding layer.

20 Claims, 9 Drawing Sheets

(56) References Cited

U.S. PATENT DOCUMENTS

| | | |
|---|---|---|
| 9,508,766 B2 | 11/2016 | Noh et al. |
| 2009/0219421 A1 | 9/2009 | Altice, Jr. et al. |
| 2010/0062559 A1 | 3/2010 | Park et al. |
| 2012/0061789 A1 | 3/2012 | Yang et al. |
| 2016/0027828 A1* | 1/2016 | Lee .................. H01L 27/14616 257/229 |
| 2019/0140003 A1* | 5/2019 | Cheng ................ H04N 5/3741 |
| 2019/0355771 A1* | 11/2019 | Cheng ................ H04N 5/37452 |

OTHER PUBLICATIONS

"Office Action of Taiwan Counterpart Application", dated Apr. 23, 2021, pp. 1-10.

* cited by examiner

METHOD OF MANUFACTURING IMAGE SENSOR

CROSS-REFERENCE TO RELATED APPLICATION

This application is a divisional application of and claims the priority benefit or a prior application Ser. No. 15/884,349, filed on Jan. 30, 2018. The prior application Ser. No. 15/884,349 claims the priority benefit of U.S. provisional application Ser. No. 62/583,445, filed on Nov. 8, 2017. The entirety of the above-mentioned patent application is hereby incorporated by reference herein and made a part of this specification.

BACKGROUND

In order to capture fast-moving objects, it is preferred to use an image sensor with a global shutter. Global shutters are often implanted by placing a memory element, in addition to a photodiode and readout circuitry, within each pixel of an image sensor array. The memory element is configured to temporarily store photo-generated charges, thereby allowing each row of the image sensor array to start an exposure at a same time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
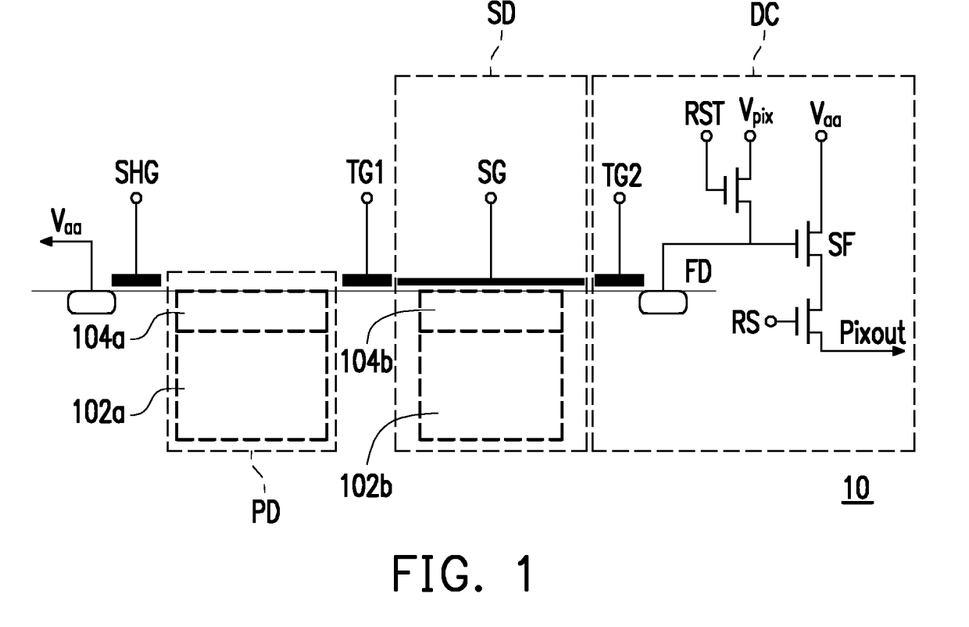
FIG. 1 is a schematic diagram illustrating an image sensor according to some embodiments of the present disclosure.

FIG. 1 is a schematic diagram illustrating an image sensor 10 according to some embodiments of the present disclosure. Referring to FIG. 1, the image sensor 10 includes a shutter gate transistor SHG, a photosensitive device PD, a first transfer gate transistor TG1, a storage device SD, and a driving circuit DC. In some embodiments, the image sensor 10 may be referred to as a complementary metal-oxide-semiconductor (CMOS) image sensor. In some embodiments, the image sensor 10 may include global shutter. It should be noted that the elements illustrated in FIG. 1 may constitute one pixel cell of the image sensor 10. In other words, for simplicity, only one pixel cell is illustrated for representation. It should be understood that the image sensor 10 may include a pixel array constituted by multiple pixel cells.

In some embodiments, the photosensitive device PD may be a photodiode. For example, the photosensitive device PD may be constituted by a P-N junction formed by a first doped region 102a and a second doped region 104a. In some embodiments, the first doped region 102a may be doped with n-type dopants while the second doped region 104a may be doped with p-type dopants. However, it construes no limitation in the disclosure. In some alternative embodiments, depending on the conductivity type of the substrate, the dopants in the first doped region 102a and the second doped region 104a may be interchanged. Upon irradiation of an incident light, the photosensitive device PD is able to accumulate image charges in response to the incident light. It should be noted that photodiode merely serves as an exemplary illustration of the photosensitive device PD, and the disclosure is not limited thereto. Other suitable photosensitive devices may be adapted as long as the device is able to accumulate image charges upon irradiation of incident light.

The shutter gate transistor SHG is coupled to the photosensitive device PD. In some embodiments, a source or a drain of the shutter gate transistor SHG is coupled to voltage $V_{aa}$ to selectively deplete the image charges accumulated in the photosensitive device PD. The first transfer gate transistor TG1 is located between the photosensitive device PD and the storage device SD. In some embodiments, the first transfer gate transistor TG1 is able to control the transfer of the image charges accumulated in the photosensitive device PD to the storage device SD. For example, during operation of the image sensor 10, the first transfer gate transistor TG1 is able to receive a transfer signal and performs transfer of the image charges accumulated in the photosensitive device PD to the storage device SD based on the transfer signal.

The storage device SD is coupled to the first transfer gate transistor TG1 and the photosensitive device PD to receive the image charges accumulated in the photosensitive device PD and to store the received image charges in the depletion region. As illustrated in FIG. 1, the storage device SD may be adjacent to the photosensitive device PD. In some embodiments, the storage device SD includes a first doped region 102b, a second doped region 104b, and a storage gate electrode SG. In some embodiments, the image charges are stored in the first doped region 102b, the second doped region 104b, and the substrate (for example, the substrate 100 illustrated in FIG. 3A) underneath the second doped region 104b. The first doped region 102b of the storage device SD and the first doped region 102a of the photosensitive device PD may be formed simultaneously by the same step. Similarly, the second doped region 104b of the storage device SD and the second doped region 104a of the photosensitive device PD may also be formed simultaneously by the same step. However, the disclosure is not limited thereto. In some alternative embodiments, the first doped regions 102a, 102b and the second doped regions 104a, 104b may be individually formed by different steps. The structure of the storage device SD will be discussed in greater detail later in conjunction with FIGS. 2, 3A-3O, and 4.

The driving circuit DC is disposed adjacent to the storage device SD. The driving circuit DC includes a second transfer gate transistor TG2, a floating diffusion FD, a reset transistor RST, a source follower transistor SF, and a row select transistor RS. In some embodiments, the second transfer gate transistor TG2 is coupled to an output of the storage device SD. Similar to the first transfer gate transistor TG1, the second transfer gate transistor TG2 also provides the function of selectively transferring the image charges accumulated in the storage device SD to the floating diffusion FD. In some embodiments, the second transfer gate transistor TG2 and the storage gate electrode SG may work together to transfer the image charges stored in the storage device SD to the floating diffusion FD. For example, a bias may be applied to the storage gate SG and a gate of the second transfer gate transistor TG2 to generate an electrical field such that a channel for movement of the charges is created. In some embodiments, due to the electrical field generated, the charges stored in the first doped region 102b, the second doped region 104b, and the substrate underneath the second doped region 104b are pulled out from the first doped region 102b and the second doped region 104b to enter a channel of the second transfer gate transistor TG2 adjacent to the storage device SD. Thereafter, these charges may travel through the channel of the second transfer gate transistor TG2 to arrive at the floating diffusion FD. In some embodiments, a drain of the second transfer gate transistor TG2 may serve as a drain for the storage device SD.

In some embodiments, the floating diffusion FD is referred to as a readout node. The floating diffusion FD is, for example, a lightly doped n-type region formed at least partially within a p-well. In some embodiments, the floating diffusion FD may serve as a capacitor for storing the image charges.

As illustrated in FIG. 1, the reset transistor RST is coupled to the floating diffusion FD and voltage $V_{pix}$ to selectively reset the image charges in the floating diffusion FD. For example, the reset transistor RST may discharge or charge the floating diffusion FD to a preset voltage in response to a reset signal. The source follower transistor SF is coupled to the floating diffusion FD and voltage $V_{aa}$. In some embodiments, the source follower transistor SF is able to provide high impedance output. For example, the source follower transistor SF may be an amplifier transistor which amplifies the signal of the floating diffusion FD for readout operation. The row select transistor RS is coupled to the source follower transistor SF. In some embodiments, another end of the row select transistor RS may be coupled to a readout column line (not shown) to selectively output the image data Pixout.

Since the driving circuit DC performs the readout function, in some embodiments, the driving circuit DC may be referred to as a readout circuit. Moreover, the diagram of the image sensor 10 illustrated in FIG. 1 is merely an example, and the disclosure is not limited thereto. In some alternative embodiments, the image sensor 10 may have different circuit designs. For example, in some embodiments, the first transfer gate transistor TG1 may be omitted. In some alternative embodiments, the layout of the components in the driving circuit DC may be altered depending on the circuit requirements. For example, the driving circuit DC is depicted as a four transistor (4T) circuitry in FIG. 1. Nevertheless, in some alternative embodiments, the driving circuit DC may be a 3T circuitry, a 5T circuitry, or any other suitable circuitry.

The operation of the image sensor 10 will be briefly described below. In order to prevent the signals to be received from mixing with the signals previously received, a reset process is first performed. During the reset process, a reference voltage $V_{cc}$ is applied onto the reset transistor RST to turn on the reset transistor RST and the voltage $V_{pix}$ is changed to the reference voltage $V_{cc}$. In some embodiments, the reference voltage $V_{cc}$ may be 3.3V. Thereafter, the electrical potential of the floating diffusion FD is pulled to the reference voltage $V_{cc}$ by the reset transistor RST and the voltage $V_{pix}$. Meanwhile, the storage gate electrode SG and the second transfer gate SG2 are turned on such that the high reference voltage $V_{cc}$ is able to deplete the charges previously stored in the storage device SD, thereby resetting the storage device SD. In some embodiments, the photosensitive device PD is depleted in conjunction with the storage device SD. For example, the voltage $V_{aa}$ may be set to the reference voltage $V_{cc}$ and the shutter gate transistor SHG may be turned on to deplete the charges previously accumulated in the photosensitive device PD. It should be noted that during this stage, the first transfer gate TG1 is off. After ensuring the storage device SD is being reset and the photosensitive device PD is being depleted, the shutter gate transistor SHG, the first transfer gate TG1, and the second transfer gate TG2 are turned off. Upon irradiation of incident light, the image charges are trapped in the photosensitive device PD. In order to access the image charges accumulated in the photosensitive device PD, the first transfer gate TG 1 and the storage gate electrode SG are turned on such that the image charges accumulated in the photosensitive device PD are transferred into the storage device SD. In order to access the image charges stored in the storage device SD, the storage gate electrode SG and the second transfer gate TG2 are turned on to transfer the image charges from the depletion region of the storage device SD into the floating diffusion FD. Subsequently, the transistor SF is turned on to amplify the signal of the floating diffusion FD for readout operation and the row select transistor RS is turned on to selectively output the image data Pixout.

Figure 2:
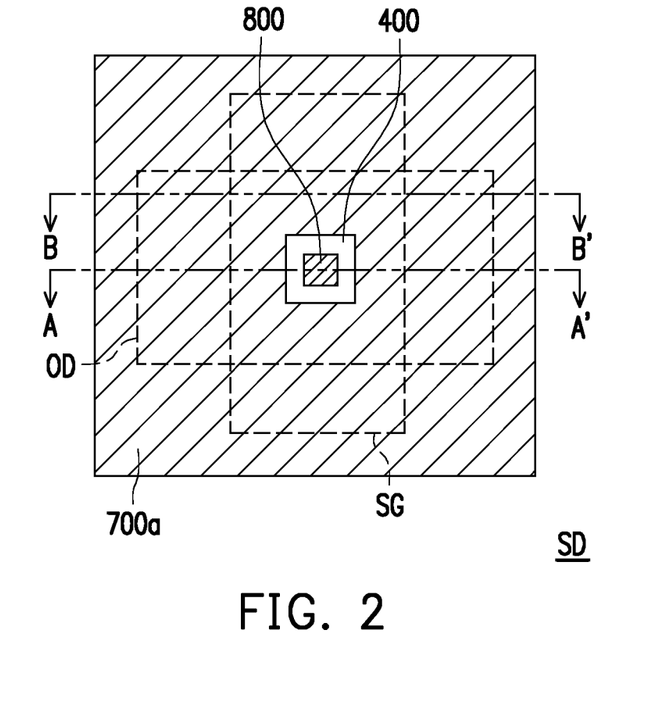
FIG. 2 is a schematic top view of the storage device in FIG. 1.
Figure 3A:
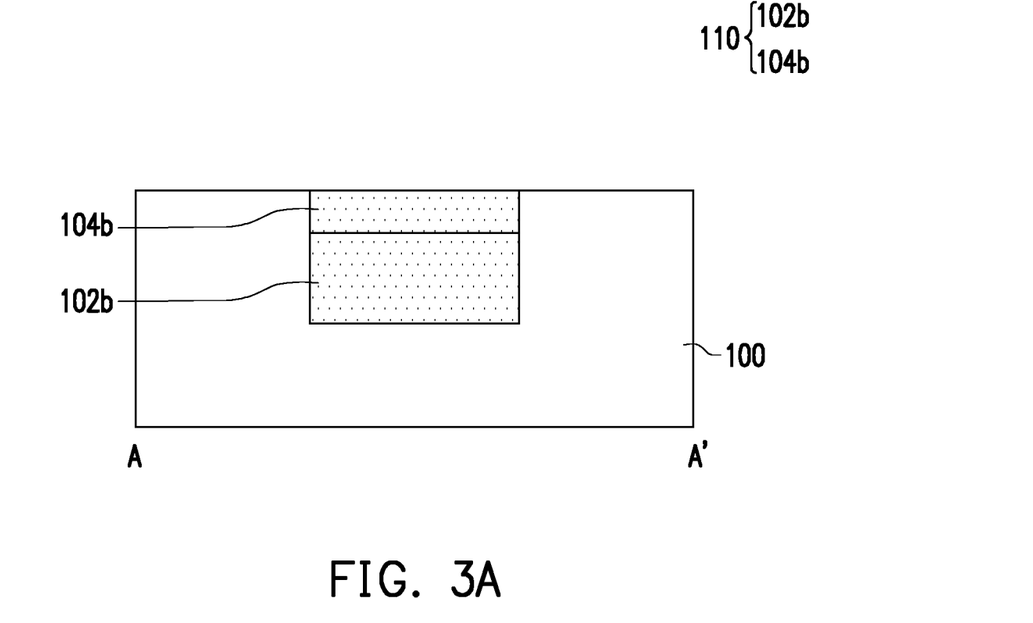
FIG. 3A to FIG. 3O are schematic cross-sectional views illustrating various stages in a manufacturing method of the storage device along line A-A' in FIG. 2.

FIG. 2 is a schematic top view of the storage device SD in FIG. 1. FIG. 3A to FIG. 3O are schematic cross-sectional views illustrating various stages in a manufacturing method of the storage device SD along line A-A' in FIG. 2. Referring to FIG. 3A, a substrate 100 is provided. In some embodiments, the substrate 100 is a semiconductor substrate. For example, the substrate 100 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the substrate 100 may be a p-type substrate. However, the disclosure is not limited thereto. In some alternative embodiments, an n-type substrate may be adapted as the substrate 100.

Thereafter, a storage node 110 is formed in the substrate 100. In some embodiments, the storage node 110 is constituted by a first doped region 102b and a second doped region 104b. The first doped region 102b may be formed by doping the substrate 100 with dopants of a first type and the second doped region 104b may be formed by doping the substrate 100 above the first doped region 102b with dopants of a second type. The dopants of the first type is different from the dopants of the second type. For example, when the substrate 100 is a p-type substrate, the first doped region 102b may be doped with n-type dopants (such as phosphorous or arsenic) and the second doped region 104b may be doped with p-type dopants (such as boron or $BF_2$) to form a P-N junction between the first doped region 102b and the second doped region 104b. Similarly, when the substrate 100 is an n-type substrate, the first doped region 102b may be doped with p-type dopants and the second doped region 104b may be doped with n-type dopants to form the P-N junction therebetween. In some embodiments, the dopants may be doped into the first doped region 102b and the second doped region 104b through an ion implantation process. As mentioned above, the first doped region 102a and the second doped region 104a of the photosensitive device PD may be formed by a similar manner as that of the first doped region 102b and the second doped region 104b. Therefore, although not illustrated, it should be understood that the photosensitive device PD is located within the substrate 100. In some embodiments, the photosensitive device PD (shown in FIG. 1) may act as a source for the storage device SD.

Figure 3B:
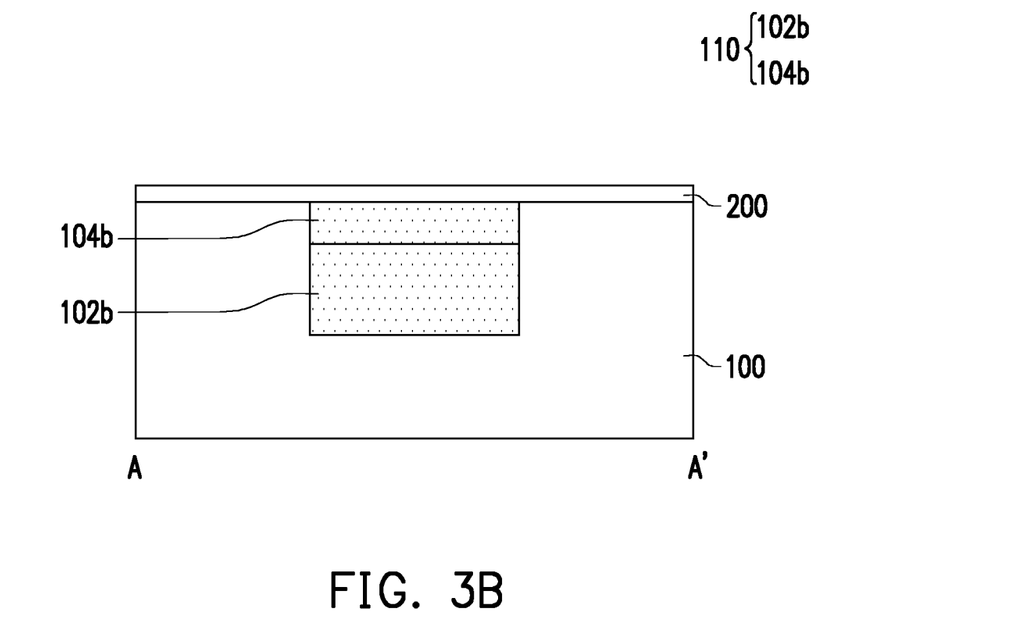

Referring to FIG. 3B, a gate dielectric layer 200 is formed to cover the substrate 100. In some embodiments, the gate dielectric layer 200 may include silicon oxide, silicon nitride, silicon oxy-nitride, or high-k dielectric materials. The high-k dielectric materials are generally dielectric materials having a dielectric constant greater than 4. In some embodiments, the high-k dielectric material may include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the gate dielectric layer 200 may be formed using a suitable process such as atomic layer deposition (ALD), chemical vapor deposition (CVD), physical vapor deposition (PVD), thermal oxidation, UV-ozone oxidation, or a combination thereof.

Figure 3C:
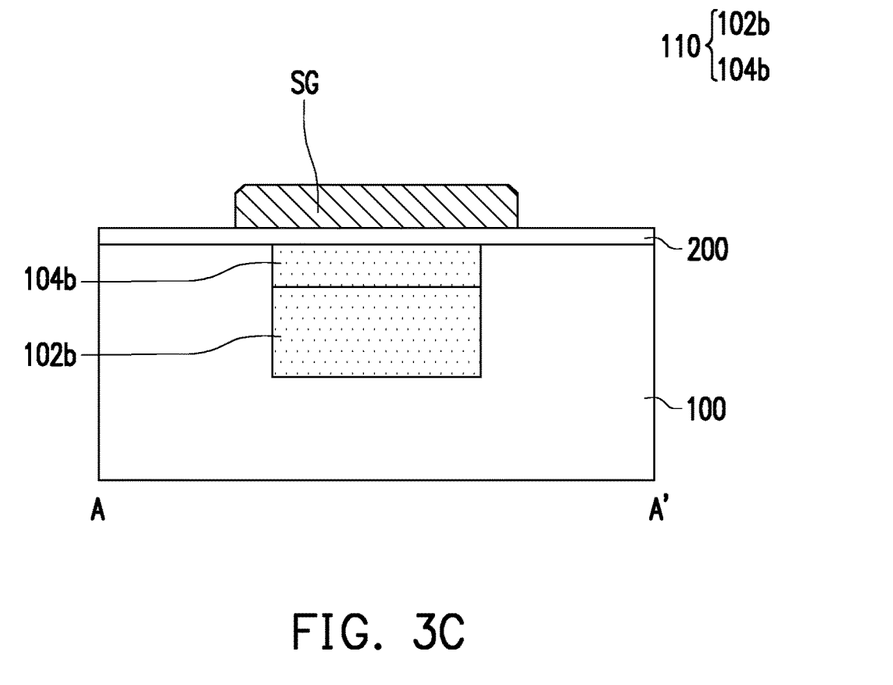

Referring to FIG. 3C, a storage gate electrode SG is formed over the gate dielectric layer 200. In some embodiments, the storage gate electrode SG is formed above the storage node 110. For example, a vertical projection of the storage gate electrode SG may overlap with the storage node 110. In some embodiments, the storage gate electrode SG may include a single-layered or a multi-layered structure. In some embodiments, the storage gate electrode SG includes a silicon-containing material, such as polysilicon, amorphous silicon, or a combination thereof. The storage gate electrode SG may be formed by using a suitable process such as ALD, CVD, PVD, plating, or a combination thereof.

Figure 3D:
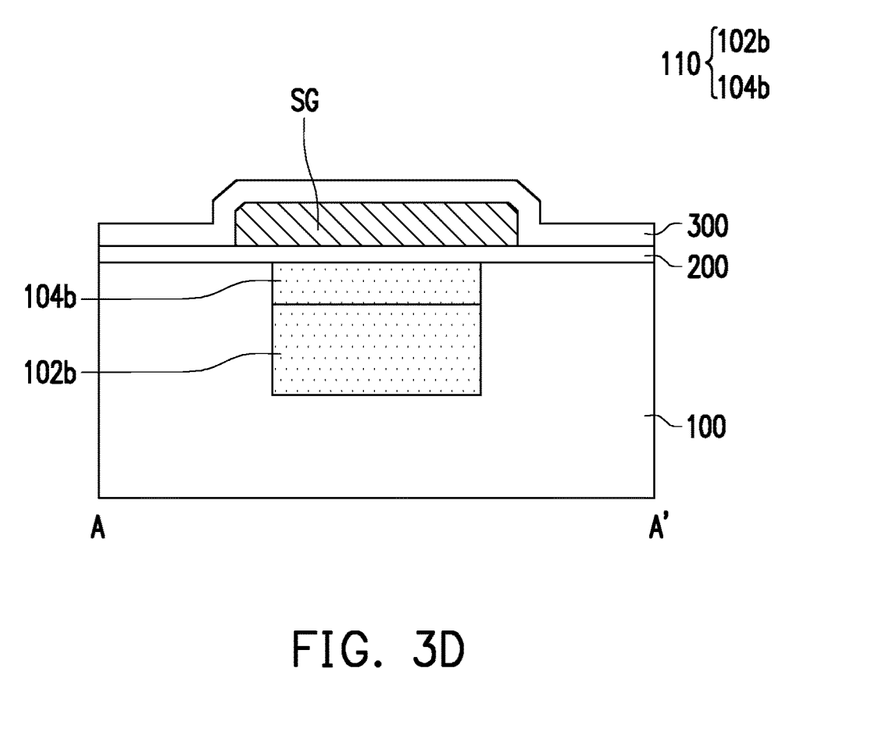

Referring to FIG. 3D, an etch stop layer 300 is formed over the gate dielectric layer 200 and the storage gate electrode SG. In some embodiments, the etch stop layer 300 includes silicon nitride, carbon-doped silicon nitride, or a combination thereof. In some embodiments, the etch stop layer 300 may be referred to as a contact etch stop layer (CESL). The etch stop layer 300 may be deposited using, for example, CVD, high density plasma (HDP) CVD, sub-atmospheric CVD (SACVD), molecular layer deposition (MLD), or other suitable methods.

Figure 3E:
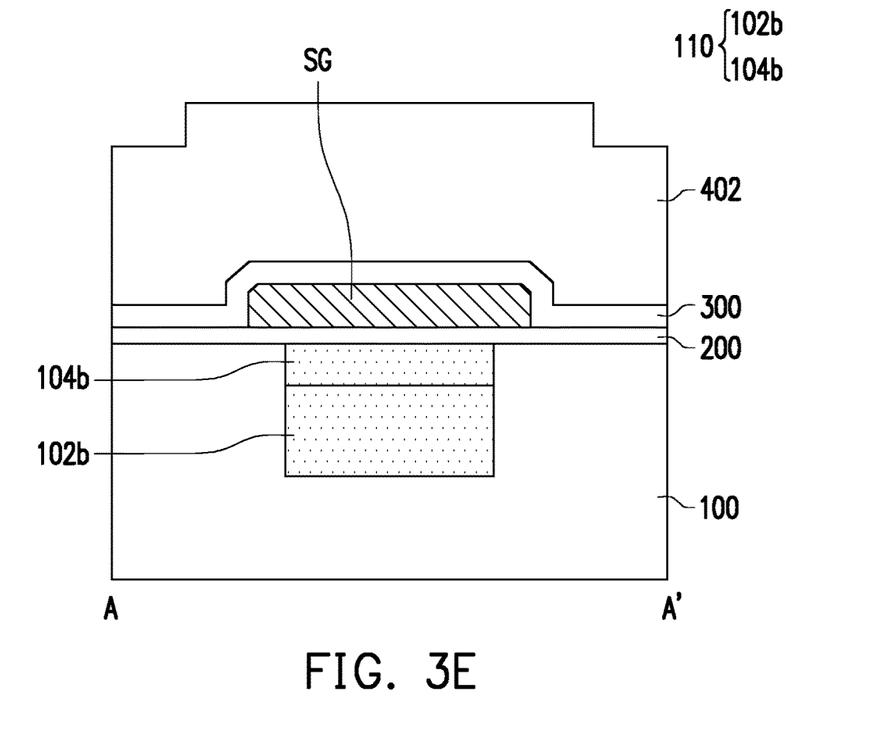

Referring to FIG. 3E, a first dielectric layer 402 is formed over the etch stop layer 300. In some embodiments, the first dielectric layer 402 may be formed in a conformal manner. In some embodiments, the first dielectric layer 402 may be referred to as interlayer dielectric layer (ILD). The first dielectric layer 402 may include silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the first dielectric layer 402 includes low-k dielectric materials. The low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In some embodiments, the first dielectric layer 402 is formed to a suitable thickness by Flowable CVD (FCVD), CVD, HDPCVD, SACVD, spin-on, sputtering, or other suitable methods.

Figure 3F:
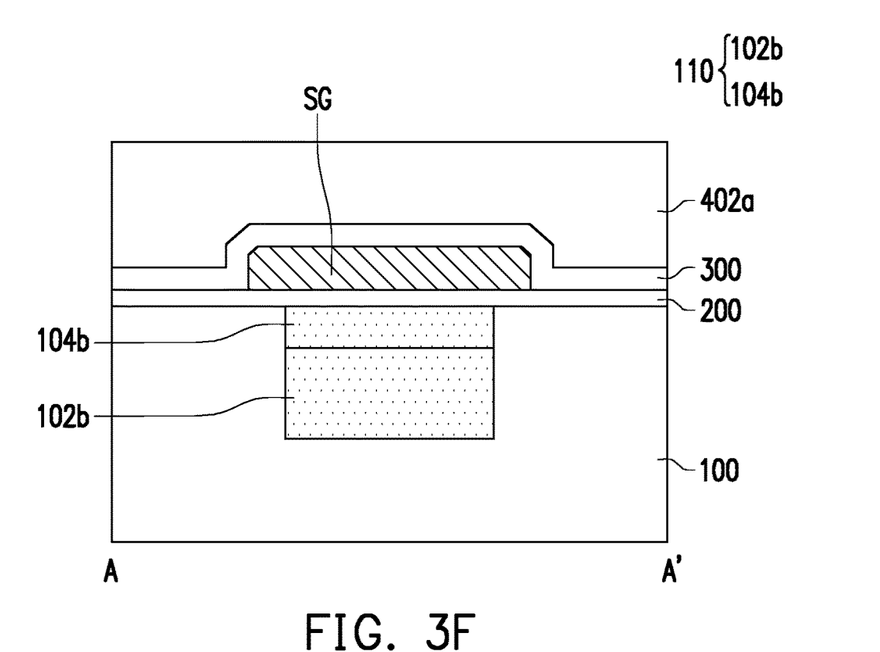

Referring to FIG. 3F, a thickness of the first dielectric layer 402 is reduced to form the first dielectric layer 402a. In some embodiments, a portion of the first dielectric layer 402 is removed through a chemical polishing (CMP) process, an etching process, or other suitable processes.

Figure 3G:
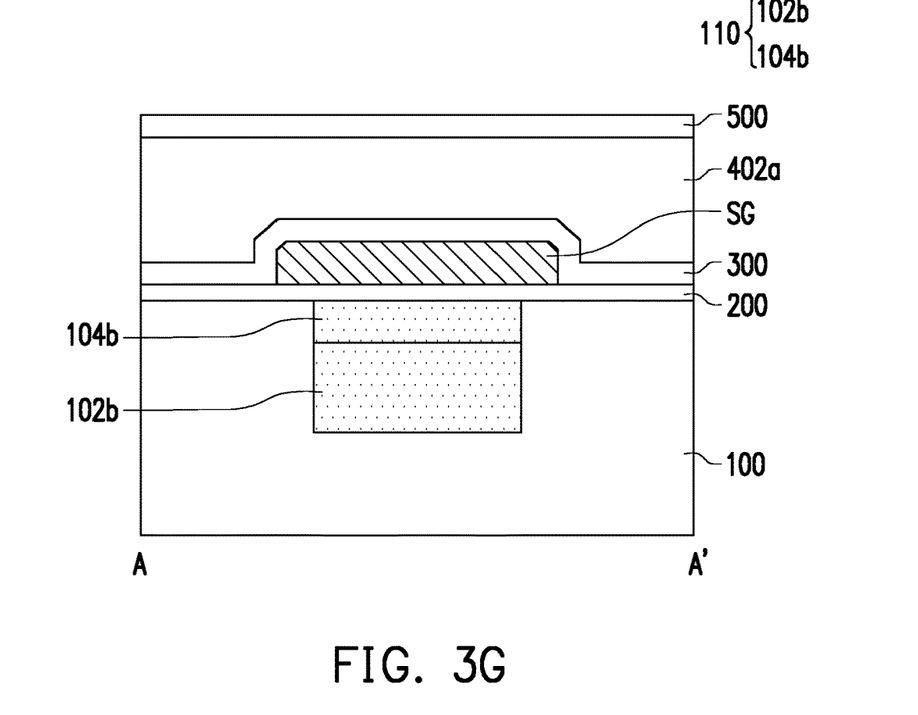

Referring to FIG. 3G, a stop layer 500 is formed to cover the first dielectric layer 402a. In some embodiments, the stop layer 500 may be an antireflection layer. The stop layer 500 may be made of, for example, silicon nitride, boron nitride, titanium nitride, or other nitride materials. In some embodiments, the stop layer 500 may be formed using CVD, plasma-enhanced chemical vapor deposition (PECVD), ALD, PVD, or a combination thereof.

Figure 3H:
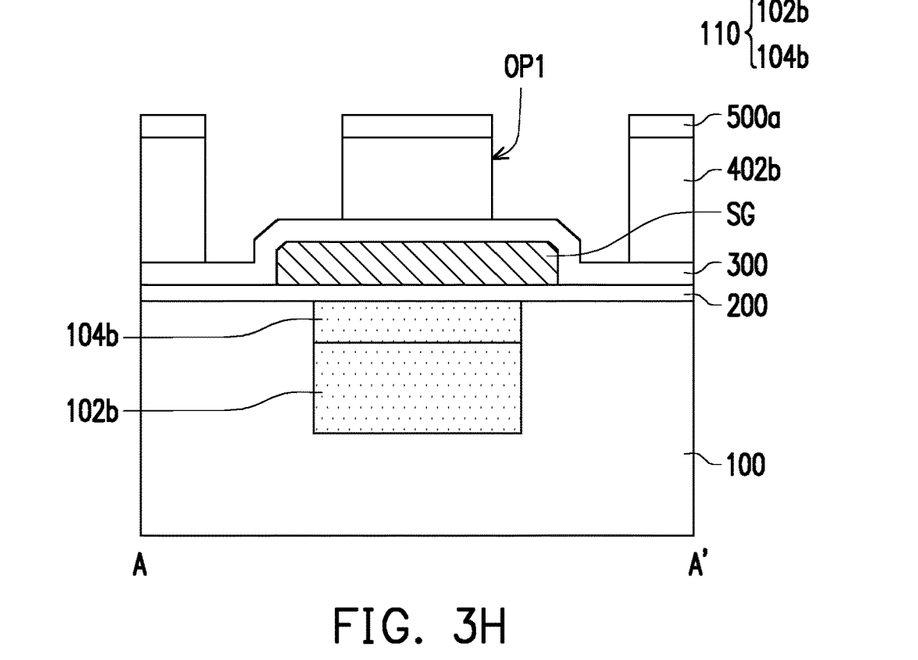

Referring to FIG. 3H, a portion of the stop layer 500 and a portion of the first dielectric layer 402a is removed to render a stop layer 500a and a first dielectric layer 402b having an opening OP1 formed therein. The opening OP1 may be formed through patterning the stop layer 500 and the first dielectric layer 402a. In some embodiments, the patterning process may include a photolithography process and an etching process. As illustrated in FIG. 3H, the opening OP1 exposes at least a portion of the etch stop layer 300.

Figure 3I:
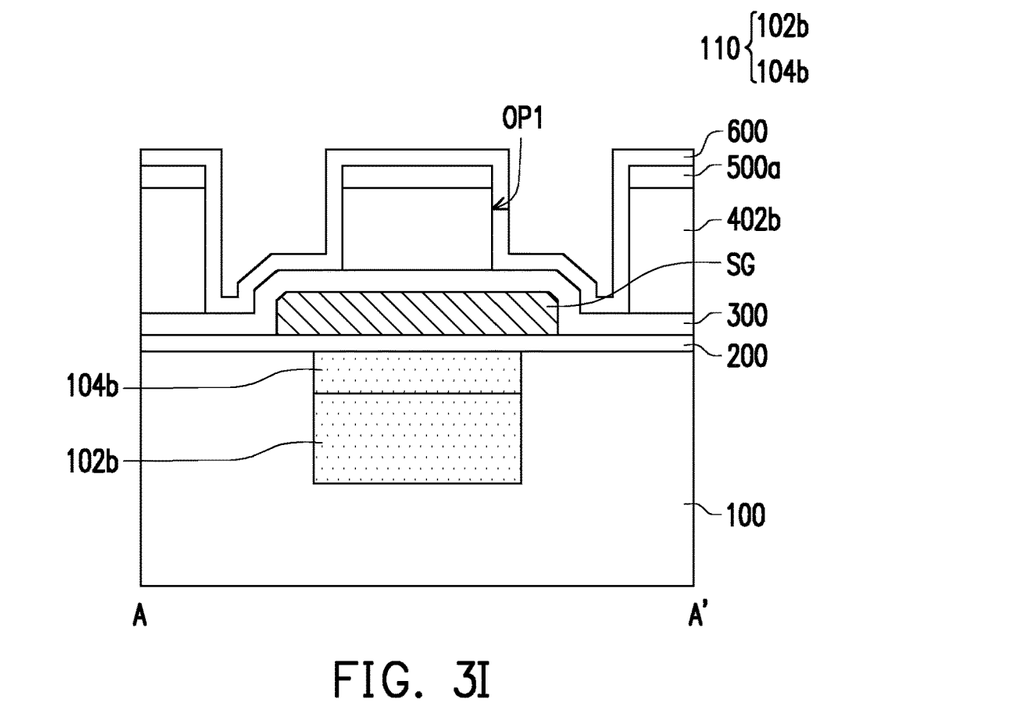

Referring to FIG. 3I, a protection material layer 600 is conformally formed over the stop layer 500a, the first dielectric layer 402b, and the etch stop layer 300. In some embodiments, the protection material layer 600 extends into the opening OP1 to cover a bottom surface and sidewalls of the opening OP1. In some embodiments, the protection material layer 600 includes $SiO_2$, SiN, or other suitable materials. In some embodiments, a thickness of the protection material layer 600 ranges between 100 Å and 300 Å. The protection material layer 600 may be formed through CVD or other suitable methods.

Figure 3J:
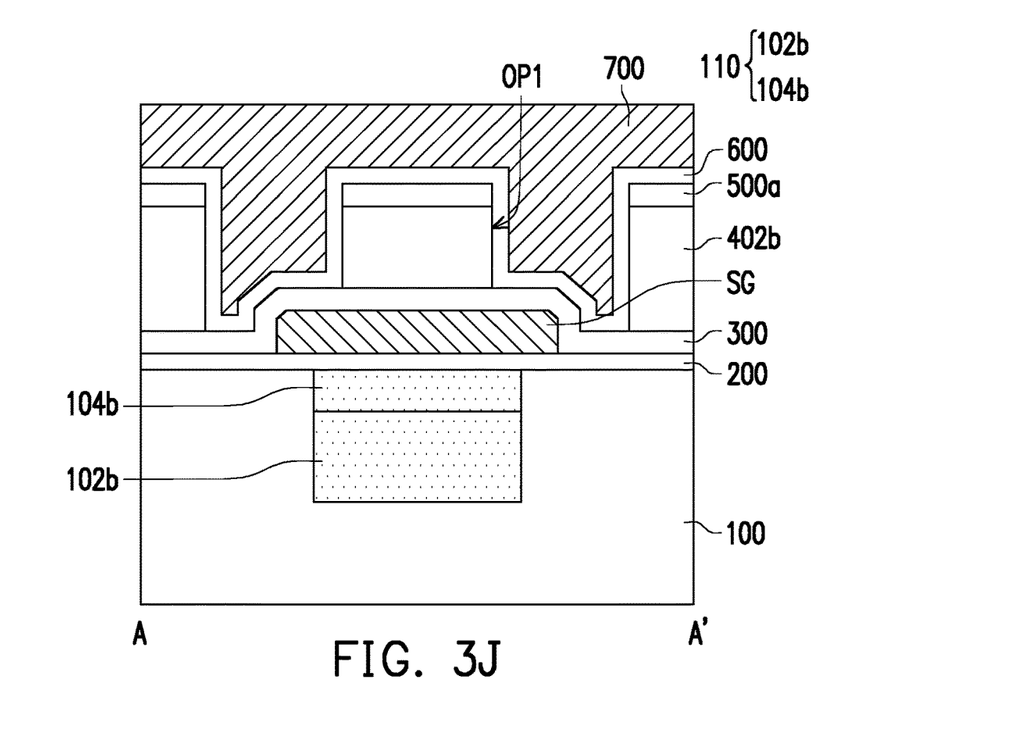

Referring to FIG. 3J, a shielding material layer 700 is deposited over the protection material layer 600 to fill up the opening OP1. In some embodiments, the shielding material layer 700 serves the function of shielding previously formed elements from incident light. Therefore, in some embodiments, the shielding material layer 700 may be made of opaque material. For example, the shielding material layer 700 may include conductive materials such as tungsten. However, the disclosure is not limited thereto. In some alternative embodiments, other opaque metallic materials may be adapted. In some embodiments, the shielding material layer 700 may be formed by, for example, electrochemical plating process, CVD, PECVD, ALD, PVD, or a combination thereof. In some embodiments, the storage device SD may be formed in conjunction with other logic devices. Under this scenario, the shielding material layer 700 of the storage device SD and metal lines of other logic devices may be formed simultaneously by the same step. In other words, the shielding material layer 700 and the metal lines of other logic devices may be considered as a same layer. It should be noted that since the shielding material layer 700 serves the function of shielding other elements from the incident light, unlike the metal lines of other logic devices, the shielding material layer 700 is not electrically connected with other conductive components within the storage device SD. For example, the shielding material layer 700 may be grounded.

Figure 3K:
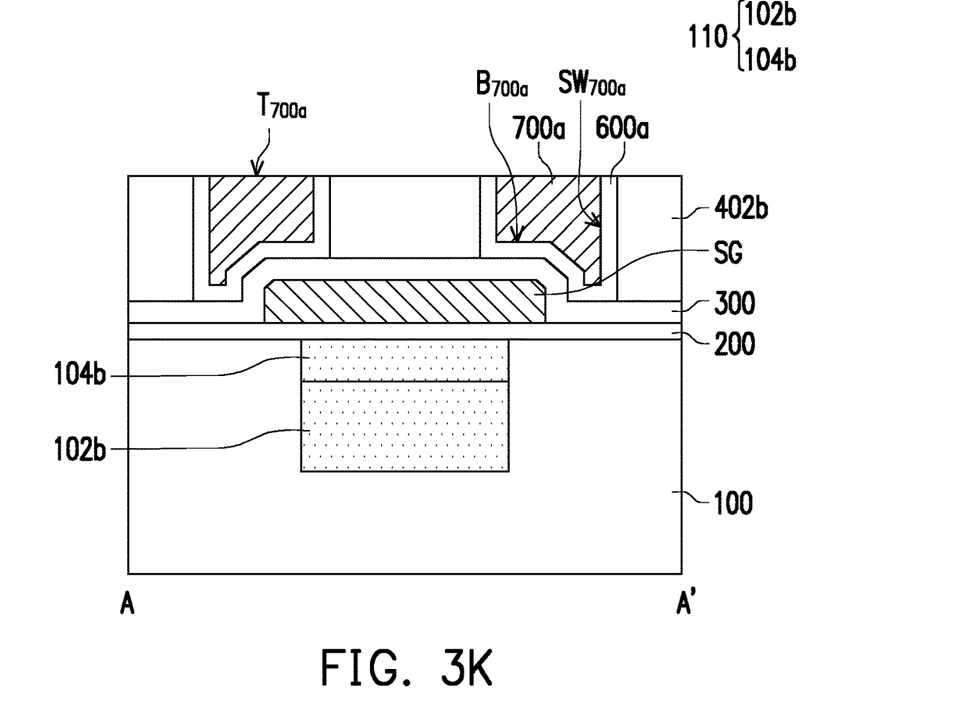

Referring to FIG. 3K, the stop layer 500a, a portion of the protection material layer 600, and a portion of the shielding material layer 700 is removed to form a protection layer 600a and a shielding layer 700a. In some embodiments, the removal of the stop layer 500a, the portion of the protection material layer 600, and the portion of the shielding material layer 700 may be achieved through a CMP process, an etching process, or other suitable processes. As illustrated in FIG. 3K, a portion of the protection layer 600a is sandwiched between the shielding layer 700a and the etch stop layer 300 and another portion of the protection layer 600a is sandwiched between the shielding layer 700a and the first dielectric layer 402b such that the protection layer 600a wraps around the shielding layer 700a. For example, the protection layer 600a may fully cover a bottom surface $B_{700a}$ and sidewalls $SW_{700a}$ of the shielding layer 700a. On the other hand, the protection layer 600a may expose a top surface $T_{700a}$ of the shielding layer 700a. In some embodiments, a thickness of the protection layer 600a ranges between 100 Å and 300 Å. In some embodiments, the etch stop layer 300 is sandwiched between the protection layer 600a and the storage gate electrode SG, between the protection layer 600a and the gate dielectric layer 200, between the first dielectric layer 402b and the gate dielectric layer 200, and between the first dielectric layer 402b and the storage gate electrode SG. It should be noted that since the etch stop layer 300 and the protection layer 600a are formed during different stages with different profiles, these two layers are considered as two distinct layers. In some embodiments, during the step of forming the opening OP1 (as shown in FIG. 3H), the etchant may damage/consume part of the etch stop layer 300, causing the thickness of the etch stop layer 300 to reduce. However, sufficient isolation between the storage gate electrode SG and the shielding layer 700a is crucial in ensuring the reliability of the storage device SD. For example, when a minimum distance between the storage gate electrode SG and the shielding layer 700a is too small (for example, smaller than 20 nm), the breakdown voltage ($V_{bd}$) of the storage device SD would be drastically decreased, causing a phenomenon of $V_{bd}$ tailing during the reliability test. In other words, the device lifetime of the storage device SD would be reduced when sufficient isolation between the storage gate electrode SG and the shielding layer 700a is not presented. By forming the protection layer 600a over the etch stop layer 300, the protection layer 600a may compensate for the loss of the etch stop layer 300 during the etching process of forming the opening OP1 in FIG. 3H. That is, the protection layer 600a and the etch stop layer 300 together are able to provide sufficient isolation between the storage gate electrode SG and the shielding layer 700a, thereby ensuring longer lifetime of the storage device SD.

Figure 3L:
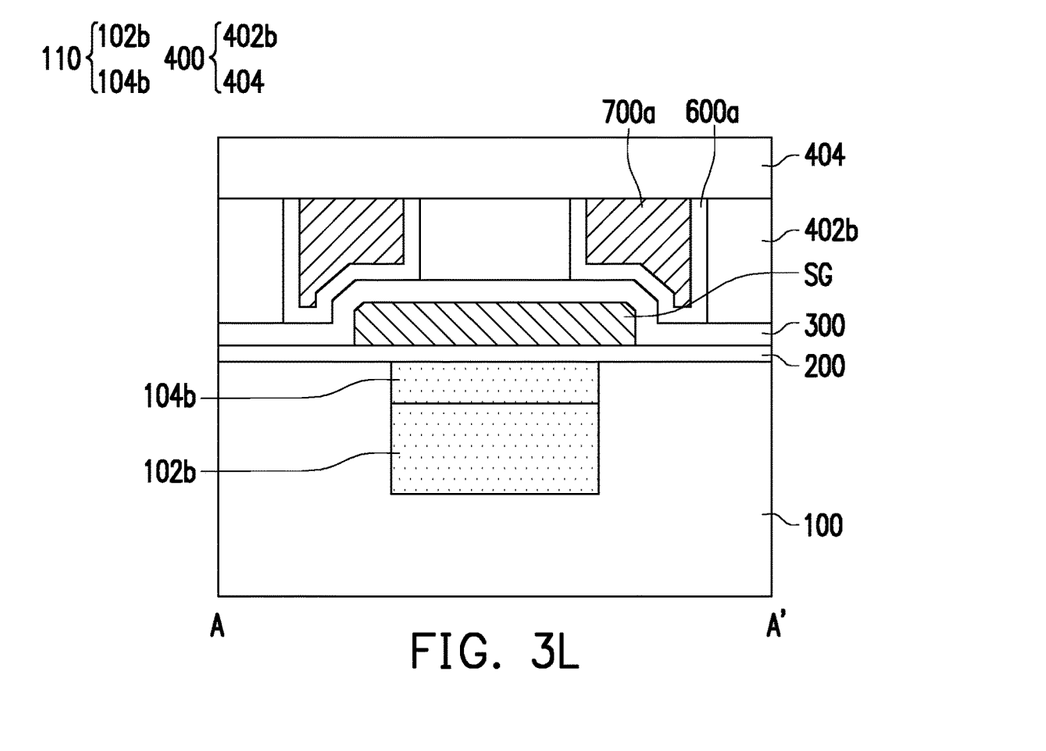

Referring to FIG. 3L, a second dielectric layer 404 is formed over the first dielectric layer 402b, the protection layer 600a, and the shielding layer 700a. Similar to the first dielectric layer 402b, the second dielectric layer 404 may also be referred to as ILD. In some embodiments, the first dielectric layer 402b and the second dielectric layer 404 may be collectively referred to as one single dielectric layer 400. In some embodiments, the second dielectric layer 404 and the first dielectric layer 402b may be made of a same material. However, the disclosure is not limited thereto. In some alternative embodiments, the second dielectric layer 404 and the first dielectric layer 402b may be made of different materials. For example, the second dielectric layer 404 may include silicon oxide, silicon nitride, silicon oxynitride, PSG, BPSG, SOG, FSG, carbon doped silicon oxide (e.g., SiCOH), polyimide, and/or a combination thereof. In some other embodiments, the second dielectric layer 404 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB, Flare, SILK® (Dow Chemical, Midland, Mich.), HSQ or SiOF, and/or a combination thereof. In some embodiments, the second dielectric layer 404 is formed to a suitable thickness by FCVD, CVD, HDPCVD, SACVD, spin-on, sputtering, or other suitable methods.

Figure 3M:
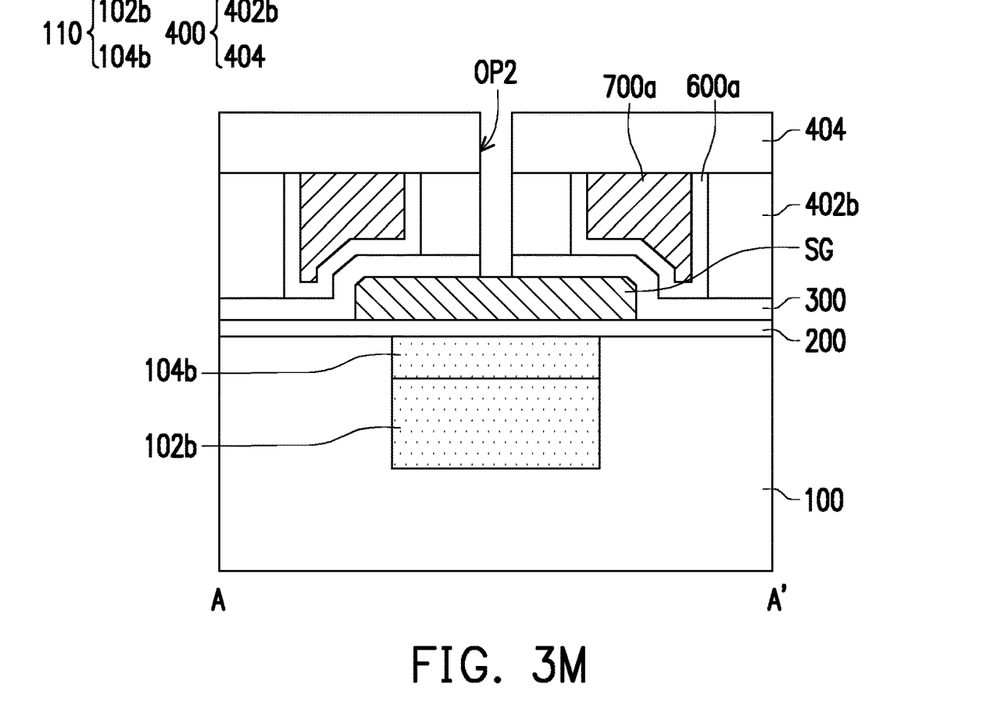

Referring to FIG. 3M, a contact opening OP2 is formed to penetrate through the second dielectric layer 404, the first dielectric layer 402b, and the etch stop layer 300. As illustrated in FIG. 3M, the contact opening OP2 exposes a portion of the storage gate electrode SG for future electrical connection. Similar to the opening OP1, the contact opening OP2 may be formed through a photolithography process and an etching process.

Figure 3N:
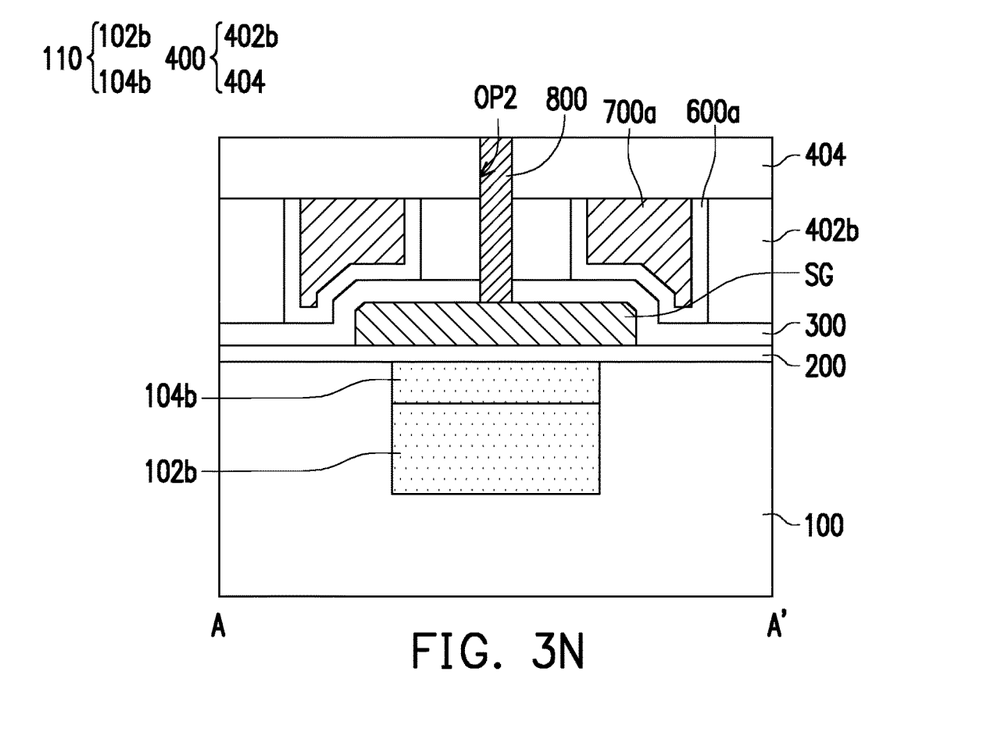
Figure 3O:
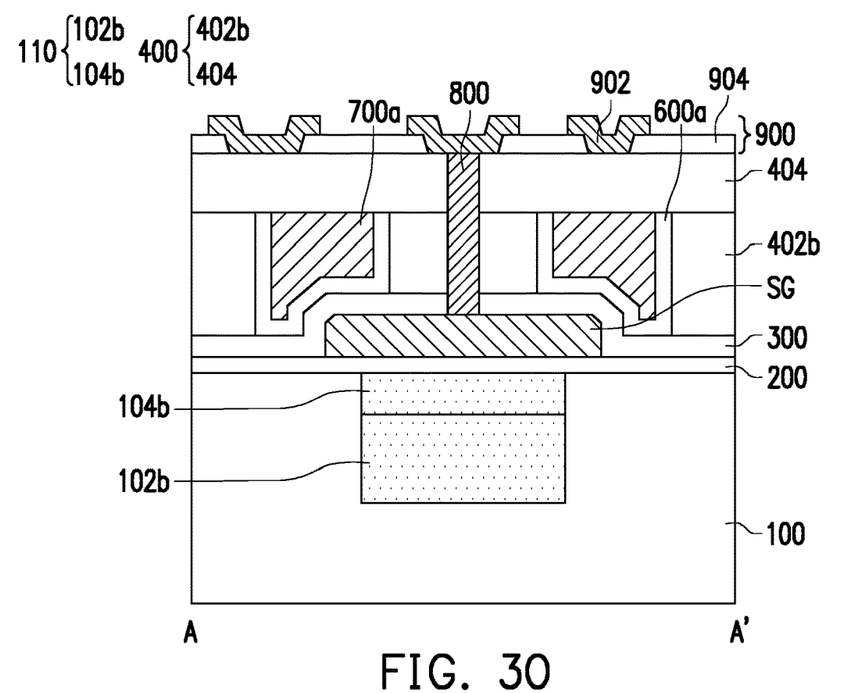

Referring to FIG. 3N, a conductive contact 800 is formed to fill into the contact opening OP2. In some embodiments, the conductive contact 800 may be formed by the following manner. First, a conductive material (not shown) is deposited over the second dielectric layer 404 and is filled into the contact opening OP2. Subsequently, portions of the conductive material located outside of the contact opening OP2 is removed to obtain the conductive contact 800. In some embodiments, the conductive material may be removed through a CMP process, an etching process, or other suitable processes.

Referring to FIG. 3O, an interconnection structure 900 is formed over the second dielectric layer 404 and the conductive contact 800. During this stage, the storage device SD is substantially completed. The interconnection structure 900 includes an interconnection dielectric layer 904 and a plurality of interconnection conductive patterns 902 at least partially embedded in the interconnection dielectric layer 904. In some embodiments, a material of the interconnection dielectric layer 904 includes polyimide, epoxy resin, acrylic resin, phenol resin, BCB, polybenzooxazole (PBO), or any other suitable polymer-based dielectric material. The interconnection dielectric layer 904, for example, may be formed by suitable fabrication techniques such as spin-on coating, CVD, PECVD, or the like. The interconnection conductive patterns 902 may be formed by the following manner. First, the interconnection dielectric layer 904 is patterned to form a plurality of openings through a photolithography process and an etching process. Thereafter, the interconnection conductive patterns 902 are formed over the interconnection dielectric layer 904 and are formed to extend into the openings of the interconnection dielectric layer 904. The interconnection conductive patterns 902 may be formed by, for example, electroplating, deposition, and/or photolithography and etching. In some embodiments, a material of the interconnection conductive patterns 902 includes aluminum, titanium, copper, nickel, tungsten, and/or alloys thereof. As illustrated in FIG. 3O, the conductive contact 800 is in contact with both of the storage gate electrode SG and the interconnection conductive patterns 902 to render electrical connection between the two. Although FIG. 3O illustrated one layer of the interconnection structure 900, the disclosure is not limited thereto. In some alternative embodiments, the interconnection structure 900 may be a multi-layered structure. For example, the interconnection structure 900 may include a plurality of interconnection dielectric layers sequentially stacked on one another and a plurality of interconnection conductive patterns 902 sandwiched between/embedded in the interconnection dielectric layers.

Figure 4:
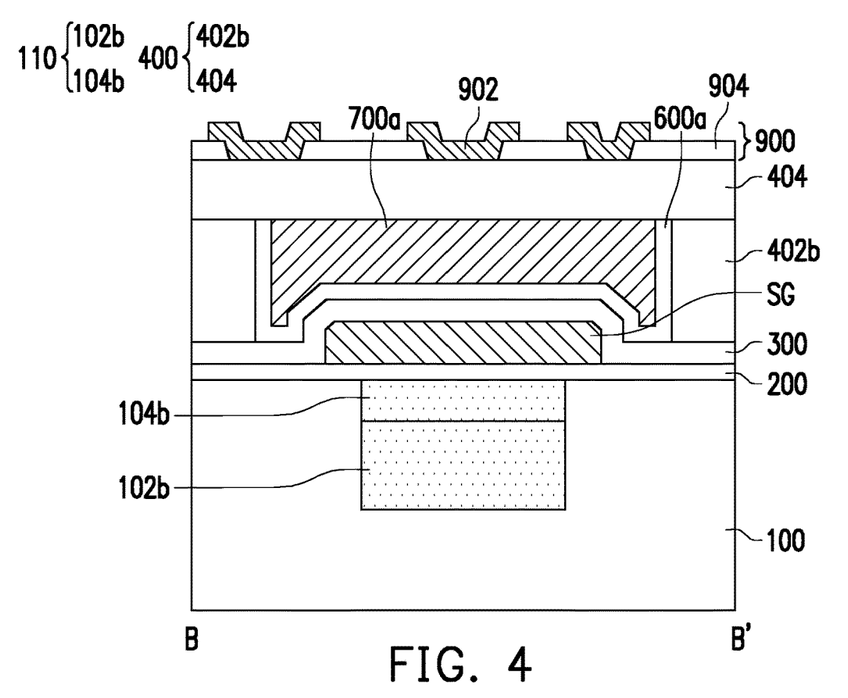
FIG. 4 is schematic cross-sectional view of the storage device along line B-B' in FIG. 2.

FIG. 4 is schematic cross-sectional view of the storage device SD along line B-B' in FIG. 2. Referring to FIG. 2, the shielding layer 700a surrounds the conductive contact 800 in the top view. Referring to FIG. 2, FIG. 3O, and FIG. 4 simultaneously, the shielding layer 700a substantially covers the storage gate electrode SG and an active region OD of the storage device SD from a top view. In some embodiments, the active region OD may be a region which performs storage function of the storage device SD. For example, the active region OD of the storage device SD may at least include the first doped region 102b, the second doped region 104b, and the storage gate electrode SG. As mentioned above, since the storage device SD is being utilized to store the image charges received from the photosensitive device PD, the active region OD of the storage device SD is preferred to be free from the incident light to avoid damage to the stored image charges. By adapting a shielding layer 700a which substantially fully covers the active region OD and the storage device SD (except for the location where the contact opening OP2 is positioned), the active region OD and the storage device SD may be shielded from the incident light. As such, the damage to the image charges stored in the storage device SD may be sufficiently prevented, thereby providing accurate image data for readout. Since the shielding layer 700a serves the function of shielding the active region OD of the storage device SD from the incident light, the shielding layer 700a may be electrically grounded through the substrate 100 in some embodiments.

In accordance with some embodiments of the disclosure, an image sensor includes a photosensitive device, a storage device, and a driving circuit. The storage device is adjacent to the photosensitive device. The storage device includes a storage node, a gate dielectric layer, a storage gate electrode, an etch stop layer, a shielding layer, and a protection layer. The gate dielectric layer is over the storage node. The storage gate electrode is over the gate dielectric layer. The etch stop layer covers the gate dielectric layer and the storage gate electrode. The shielding layer is over the storage gate electrode. The protection layer is sandwiched between the etch stop layer and the shielding layer. The driving circuit is adjacent to the storage device.

In accordance with some alternative embodiments of the disclosure, an image sensor includes a storage device, a photosensitive device, and a driving circuit. The storage device includes a substrate, a P-N junction, a gate dielectric layer, a storage gate electrode, a shielding layer, a protection layer, and a dielectric layer. The P-N junction is located within the substrate. The gate dielectric layer is over the substrate. The storage gate electrode is over the gate dielectric layer. The shielding layer is over the storage gate electrode. The protection layer covers a bottom surface and sidewalls of the shielding layer. The dielectric layer is over the shielding layer. The photosensitive device is adjacent to the storage device and is located within the substrate. The driving circuit is adjacent to the storage device.

In accordance with some embodiments of the disclosure, a method of manufacturing an image sensor includes at least the following steps. A substrate is provided. A storage node is formed in the substrate. A gate dielectric layer is formed over the substrate. A storage gate electrode, an etch stop layer, and a first dielectric layer are sequentially formed over the gate dielectric layer. A stop layer is formed over the first dielectric layer. A portion of the stop layer and a portion of the first dielectric layer are removed to form an opening. The opening exposes at least a portion of the etch stop layer. A protection layer is formed over the etch stop layer and the first dielectric layer. A shielding layer is formed over the protection layer such that the protection layer covers a bottom surface and sidewalls of the shielding layer. A second dielectric layer is formed over the shielding layer.

In accordance with some alternative embodiments of the disclosure, a method of manufacturing an image sensor includes at least the following steps. A storage node is formed in a substrate. A gate dielectric layer, a storage gate electrode, and a first dielectric layer are sequentially formed over the substrate. A portion of the first dielectric layer is removed to form an opening. A protection layer and a shielding layer are sequentially filled into the opening. The protection layer laterally surrounds the shielding layer and at least a portion of the protection layer is located between the storage gate electrode and the shielding layer. A second dielectric layer is formed over the shielding layer.

In accordance with some alternative embodiments of the disclosure, a method of manufacturing an image sensor includes at least the following steps. A photosensitive device is formed in a substrate. A storage device is formed adjacent to the photosensitive device. The step of forming the storage device includes at least the following steps. A P-N junction is formed in the substrate. A gate dielectric layer, a storage gate electrode, and a first dielectric layer are sequentially formed over the substrate. A portion of the first dielectric layer is removed to form an opening. A protection layer is filled into the opening to cover sidewalls and a bottom surface of the opening. A shielding layer is deposited on the protection layer to fill up the opening. A second dielectric layer is formed over the shielding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an image sensor, comprising:

forming a storage node in a substrate;

sequentially forming a gate dielectric layer, a storage gate electrode, and a first dielectric layer over the substrate;

removing a portion of the first dielectric layer to form an opening;

sequentially filling a protection layer and a shielding layer into the opening, wherein the protection layer laterally surrounds the shielding layer and at least a portion of the protection layer is located between the storage gate electrode and the shielding layer; and forming a second dielectric layer over the shielding layer.

2. The method according to claim 1, further comprising conformally forming an etch stop layer over the gate dielectric layer and the storage gate electrode, wherein at least a portion of the protection layer is sandwiched between the etch stop layer and the shielding layer.

3. The method according to claim 1, further comprising forming a stop layer over the first dielectric layer, wherein the opening is formed by removing a portion of the first dielectric layer and a portion of the stop layer.

4. The method according to claim 3, wherein the step of filling the shielding layer into the opening comprises:
depositing a shielding material layer over the protection layer in the opening; and
removing the stop layer and a portion of the shielding material layer to form the shielding layer.

5. The method according to claim 1, further comprising:
forming a contact opening penetrating through the second dielectric layer and the first dielectric layer;
forming a conductive contact in the contact opening; and
forming an interconnection structure over the second dielectric layer such that the interconnection structure is electrically connected to the storage gate electrode through the conductive contact.

6. The method according to claim 1, wherein the step of forming the storage node in the substrate comprises:
doping the substrate with dopants of a first type to form a first doped region; and
doping the substrate above the first doped region with dopants of a second type to form a second doped region, wherein the dopants of the first type are different from the dopants of the second type.

7. A method of manufacturing an image sensor, comprising:
providing a substrate;
forming a storage node in the substrate;
forming a gate dielectric layer over the substrate;
sequentially forming a storage gate electrode, an etch stop layer, and a first dielectric layer over the gate dielectric layer;
forming a stop layer over the first dielectric layer;
removing a portion of the stop layer and a portion of the first dielectric layer to form an opening, wherein the opening exposes at least a portion of the etch stop layer;
forming a protection layer over the etch stop layer and the first dielectric layer;
forming a shielding layer over the protection layer such that the protection layer covers a bottom surface and sidewalls of the shielding layer; and
forming a second dielectric layer over the shielding layer.

8. The method according to claim 7, further comprising:
forming a contact opening penetrating through the second dielectric layer, the first dielectric layer, and the etch stop layer;
forming a conductive contact in the contact opening; and
forming an interconnection structure over the second dielectric layer such that the interconnection structure is electrically connected to the storage gate electrode through the conductive contact.

9. The method according to claim 7, wherein the step of forming the storage node in the substrate comprises:
doping the substrate with dopants of a first type to form a first doped region; and
doping the substrate above the first doped region with dopants of a second type to form a second doped region, wherein the dopants of the first type are different from the dopants of the second type.

10. The method according to claim 7, wherein the step of forming the shielding layer comprises:
depositing a shielding material layer to fill up the opening; and
removing the stop layer and a portion of the shielding material layer to form the shielding layer.

11. The method according to claim 7, wherein a thickness of the protection layer ranges between 100 Å and 300 Å.

12. The method according to claim 7, wherein a material of the protection layer comprises $SiO_2$ or SiN.

13. A method of manufacturing an image sensor, comprising:
forming a photosensitive device in a substrate; and
forming a storage device adjacent to the photosensitive device, comprising:
forming a P-N junction in the substrate;
sequentially forming a gate dielectric layer, a storage gate electrode, and a first dielectric layer over the substrate;
removing a portion of the first dielectric layer to form an opening;
filling a protection layer into the opening to cover sidewalls and a bottom surface of the opening;
depositing a shielding layer on the protection layer to fill up the opening; and
forming a second dielectric layer over the shielding layer.

14. The method according to claim 13, further comprising conformally forming an etch stop layer over the gate dielectric layer and the storage gate electrode, wherein at least a portion of the protection layer is sandwiched between the etch stop layer and the shielding layer.

15. The method according to claim 13, further comprising forming a stop layer over the first dielectric layer, wherein the opening is formed by removing a portion of the first dielectric layer and a portion of the stop layer.

16. The method according to claim 15, wherein the step of depositing the shielding layer comprises:
depositing a shielding material layer over the protection layer in the opening; and
removing the stop layer and a portion of the shielding material layer to form the shielding layer.

17. The method according to claim 13, further comprising:
forming a contact opening penetrating through the second dielectric layer and the first dielectric layer;
forming a conductive contact in the contact opening; and
forming an interconnection structure over the second dielectric layer such that the interconnection structure is electrically connected to the storage gate electrode through the conductive contact.

18. The method according to claim 13, wherein the step of forming the P-N junction in the substrate comprises:
doping the substrate with dopants of a first type to form a first doped region; and
doping the substrate above the first doped region with dopants of a second type to form a second doped region, wherein the dopants of the first type are different from the dopants of the second type.

19. The method according to claim 13, wherein the step of forming the photosensitive device in the substrate comprises:
   doping the substrate with dopants of a first type to form a third doped region; and
   doping the substrate above the third doped region with dopants of a second type to form a fourth doped region, wherein the dopants of the first type are different from the dopants of the second type.

20. The method according to claim 19, wherein the third doped region and the fourth doped region of the photosensitive device and the P-N junction of the storage device are simultaneously formed.

* * * * *